United States Patent
Guo et al.

(10) Patent No.: US 8,084,346 B1
(45) Date of Patent: Dec. 27, 2011

(54) REPLACEMENT METAL GATE METHOD

(75) Inventors: Dechao Guo, Fishkill, NY (US); Gan Wang, Fishkill, NY (US); Yanfeng Wang, Fishkill, NY (US); Keith Kwong Hon Wong, Wappingers Falls, NY (US); Jun Yuan, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/908,016

(22) Filed: Oct. 20, 2010

(51) Int. Cl.
*H01L 21/28* (2006.01)
(52) U.S. Cl. ................. 438/595; 257/E21.182
(58) Field of Classification Search .................. 438/585, 438/595; 257/E21.159, E21.177, E21.182
See application file for complete search history.

(56) References Cited

U.S. PATENT DOCUMENTS

| | | | |
|---|---|---|---|
| 3,943,047 A * | 3/1976 | Cruzan et al. | 204/192.32 |
| 5,162,261 A * | 11/1992 | Fuller et al. | 438/640 |
| 5,629,237 A | 5/1997 | Wang et al. | |
| 5,750,441 A | 5/1998 | Figura et al. | |
| 6,743,683 B2 * | 6/2004 | Barns et al. | 438/299 |

* cited by examiner

*Primary Examiner* — N Drew Richards
*Assistant Examiner* — Daniel Shook
(74) *Attorney, Agent, or Firm* — Yuanmin Cai; Hoffman Warnick LLC

(57) ABSTRACT

A method includes forming a dummy gate in a dielectric layer on a substrate, the dummy gate including a sacrificial oxide layer and a dummy gate body over the sacrificial oxide layer; removing the dummy gate body resulting in a gate opening with the sacrificial oxide layer in a bottom of the gate opening; performing an off-axis sputtering to create an angled entrance on the gate opening; removing the sacrificial oxide layer; and forming a replacement gate in the gate opening.

20 Claims, 6 Drawing Sheets

REPLACEMENT METAL GATE METHOD

BACKGROUND

1. Technical Field

The disclosure relates generally to integrated circuit (IC) fabrication, and more particularly, to a replacement metal gate method and related transistors.

2. Background Art

In IC fabrication, areas in which a metal gate is to exist are oftentimes filled with a dummy gate material that is later replaced with the metal gate material. The dummy gate material holds the position for the metal gate and prevents damage to the metal gate material that would occur to the metal gate material if it were in place during certain processing. One challenge in replacement metal gate processing is filling the gate area with metal after removal of the dummy gate material. In particular, as shown in FIG. 1, as IC technology has progressed towards ever smaller technology nodes, e.g., 32 nanometers, gate openings 10 have progressively become smaller such that voids 12 exist in the conductive metal fill 14 deposited in the gate areas. Voids 12 are created because the metal fill cannot progress through the narrowed opening and does not adequately fill spaces below the narrowed opening. These voids lead to, for example, high gate resistance and improper functioning due to insufficient work function metal in the gate.

BRIEF SUMMARY

A first aspect of the disclosure provides a method comprising: forming a dummy gate in a dielectric layer on a substrate, the dummy gate including a sacrificial oxide layer and a dummy gate body over the sacrificial oxide layer; removing the dummy gate body resulting in a gate opening with the sacrificial oxide layer in a bottom of the gate opening; performing an off-axis sputtering to create an angled entrance on the gate opening; removing the sacrificial oxide layer; and forming a replacement gate in the gate opening.

A second aspect of the disclosure provides a transistor comprising: a metal gate having a gate body having a lower extent having a first width and an upper extent having a second width, the second width being greater than the first width.

A third aspect of the disclosure provides a transistor comprising: a metal gate having a spacer adjacent thereto, the spacer having a substantially horizontally planar upper surface.

A fourth aspect of the disclosure provides a method comprising: forming a dummy gate in a dielectric layer on a substrate, the dummy gate including a sacrificial oxide layer, a dummy gate body over the sacrificial oxide layer and a cap over the dummy gate body; removing the dummy gate body resulting in a gate opening with the sacrificial oxide layer in a bottom of the gate opening; performing an off-axis sputtering to create an angled entrance on the gate opening, the off-axis sputtering employing an angle in the range of approximately 70° to 89° relative to a surface of the dielectric layer; removing the sacrificial oxide layer by performing a wet etch selective to the sacrificial oxide layer; and forming a replacement gate in the gate opening.

A fifth aspect of the disclosure includes a method comprising: forming a dummy gate in a dielectric layer on a substrate, the dummy gate including a sacrificial oxide layer, a dummy gate body over the sacrificial oxide layer and a cap over the dummy gate body, wherein the sacrificial oxide layer includes at least one of silicon oxide and silicon oxynitride having a low density; removing the dummy gate body resulting in a gate opening with the sacrificial oxide layer in a bottom of the gate opening; performing an off-axis sputtering to create an angled entrance on the gate opening, the off-axis sputtering employing an angle in the range of approximately 70° to 89° relative to a surface of the dielectric layer and including continually rotating the substrate relative to a direction of the sputtering to create the angled entrance along substantially all of the gate opening; removing the sacrificial oxide layer by performing a wet etch selective to the sacrificial oxide layer; and forming a replacement gate in the gate opening.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

As indicated above, the disclosure provides a replacement metal gate method and related transistors. Referring to FIGS. 2-11, cross-sectional views of embodiments of a method are illustrated.

Figure 1:
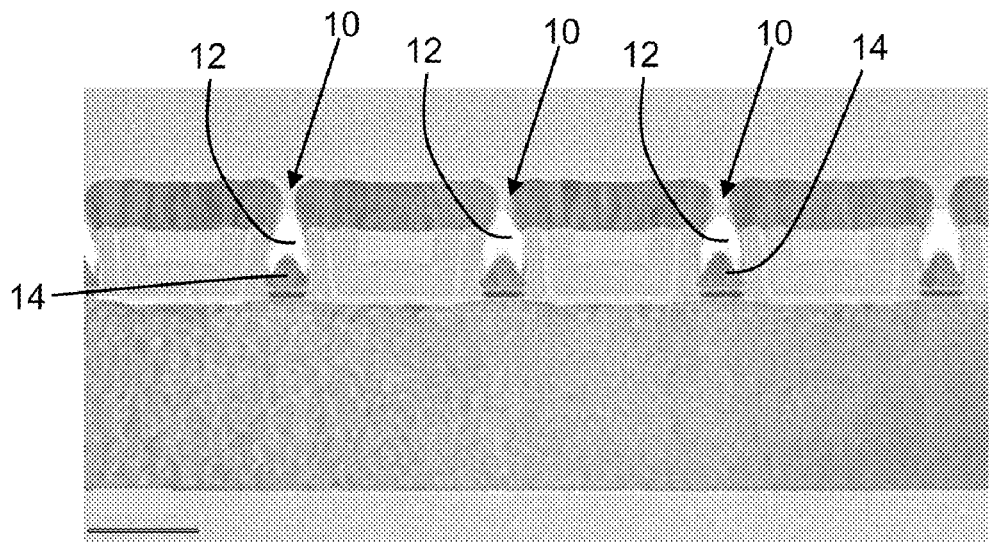
FIG. 1 shows an image of a cross-section of a conventional replacement metal gate structure.
Figure 2:
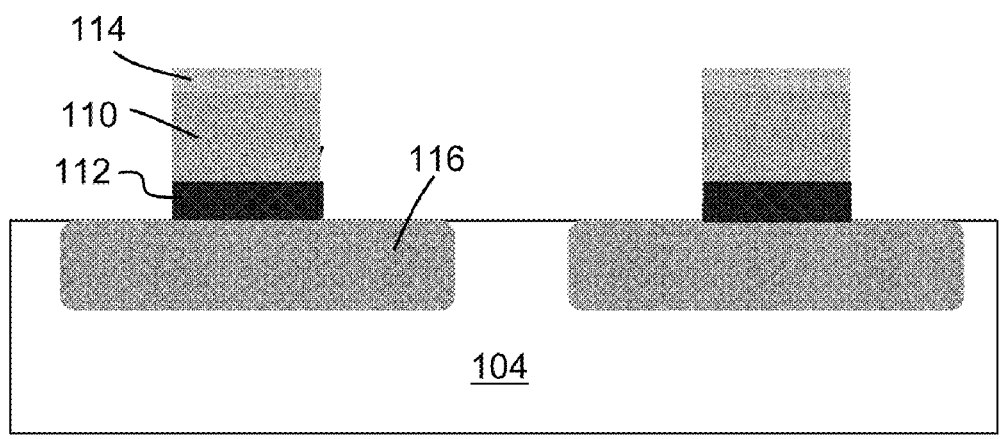
FIGS. 2-11 show cross-sectional views of embodiments of a replacement metal gate process according to the invention with FIGS. 10 and 11 showing cross-sections of two embodiments of the resulting transistor.

FIGS. 2-5 show processes for forming a dummy gate 100 (FIG. 5) in a dielectric layer 102 (FIGS. 4-5) on a substrate 104. Two dummy gates 100 are shown in each FIG. for reasons to be explained herein. As will be understood, any isolation regions in substrate 104 required between dummy gates 100 (FIG. 5) have been omitted for clarity. In FIG. 2, substrate 104 is shown having parts of dummy gate 100 (FIG. 5) formed thereon, i.e., a dummy body 110, a sacrificial oxide layer 112 and an optional cap 114 over the dummy gate body. Dummy gate body 110 is over sacrificial oxide layer 112.

Substrate 104 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). Furthermore, a portion or entire semiconductor substrate may be strained. Substrate 104 is shown having an active region 116 formed therein, e.g., made using appropriate masking and ion implantation.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Dummy gate body 110 may include any now known or later developed material appropriate for holding a position within a dielectric layer. In one embodiment, dummy gate body 110 includes a polysilicon. Other examples include amorphous silicon. Sacrificial oxide layer 112 may include, for example, silicon oxide ($SiO_2$) and/or silicon oxynitride ($SiO_xN_y$), etc. In one embodiment, sacrificial oxide layer 112 includes a low density oxide, e.g., <1.9 grams per cubic centimeter (g/cc)). Optional cap 114 may include, for example, silicon nitride ($Si_3N_4$). The structure shown in FIG. 2 may be formed using any now known or later developed techniques, e.g., material deposition, mask material deposition, patterning and etching, and etching to form the structure illustrated.

Figure 3:
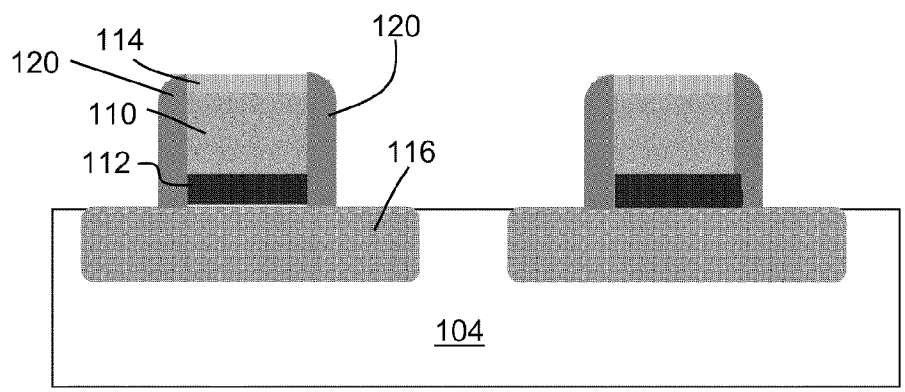

Referring to FIG. 3, a spacer 120 may formed about dummy gate body 110, sacrificial oxide layer 112 and cap 114. Spacer 120 may be formed using conventional techniques, for example, deposition of silicon nitride ($Si_3N_4$) and reactive ion etching to form the well-known rounded top spacers 120.

Figure 4:
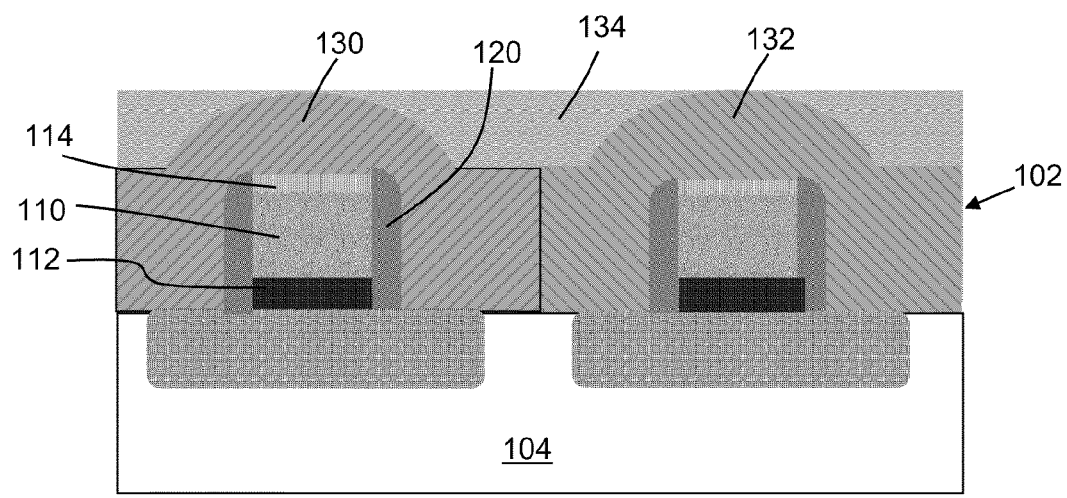

FIG. 4 shows the structure after deposition of a dielectric layer 102 (also where 130, 132 are positioned collectively) over dummy gate body 110. Dielectric layer 102 may include a single layer including but not limited to: silicon nitride ($Si_3N_4$), silicon oxide ($SiO_2$), fluorinated $SiO_2$ (FSG), hydrogenated silicon oxycarbide (SiCOH), porous SiCOH, borophospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available form JSR Corporation, other low dielectric constant (<3.9) material, or layers thereof.

Figure 5:
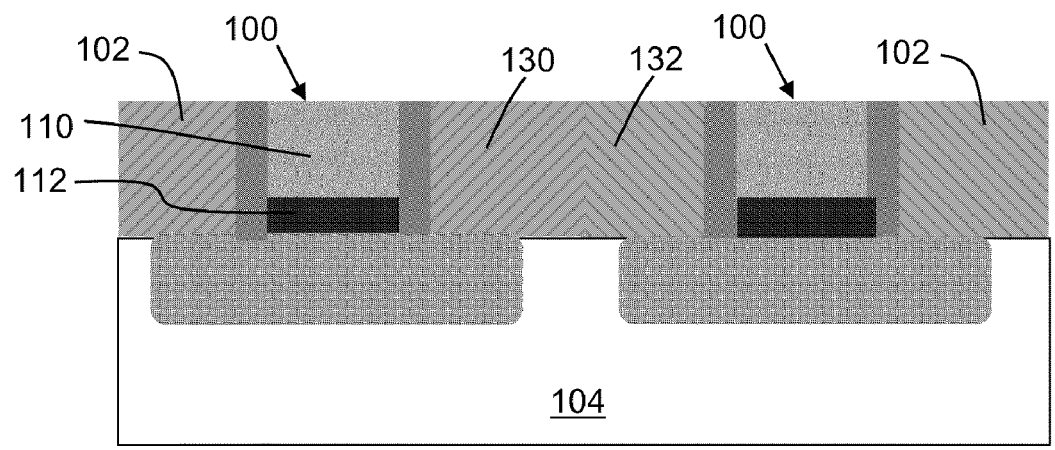

Alternatively, dielectric layer 102 may include numerous layers 130, 132. For example, as known in the art, the application of stresses to field effect transistors (FETs) is known to improve their performance. When applied in a longitudinal direction (i.e., in the direction of current flow), tensile stress is known to enhance electron mobility (or n-channel FET (NFET) drive currents) while compressive stress is known to enhance hole mobility (or p-channel FET (PFET) drive currents). One way to apply such stresses to a FET is the use of intrinsically-stressed dielectric layers, e.g., barrier silicon nitride liners. For example, a tensile-stressed silicon nitride liner may be used to cause tension in an NFET channel while a compressively-stressed silicon nitride liner may be used to cause compression in a PFET channel. Accordingly, a dual/hybrid liner scheme is necessary to induce the desired stresses in an adjacent NFET and PFET. FIG. 4 also shows the structure after the optional step of deposition of an intrinsically stressed dielectric layers 130, 132 over dummy gate body 110, sacrificial oxide layer 112 and cap 114. As illustrated, one type of stressed dielectric layer 130, e.g., tensile, is shown over the structure on the left, while another type stressed dielectric layer 132, e.g., compressive, is shown over the structure on the right. This arrangement assumes that the resulting transistors will be an NFET on the left and a PFET on the right. The arrangement also shows an oxide cap layer 134 over layers 130, 132 after planarization, e.g., chemical mechanical polishing (CMP). FIG. 5 shows dummy gates 100 after further planarization to expose dummy gate body 110.

Figure 6:
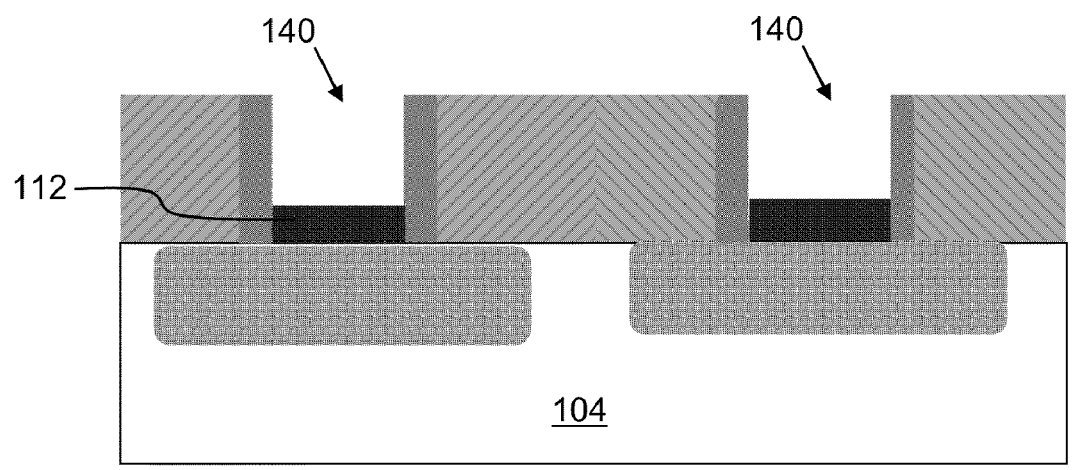

Turning to FIG. 6, dummy gate body 110 (FIG. 5) is removed resulting in a gate opening 140 with sacrificial oxide layer 112 in a bottom of the gate opening. In one embodiment, dummy gate body 110 (FIG. 5) removing includes performing a wet etch selective to sacrificial oxide layer 112. For example, where dummy gate body 110 includes polysilicon, the wet etch may use ammonium hydroxide. Other examples include: tetra methyl ammonia hydroxide (TMAH), warm or hot ammonia, or hot tetra ethyl ammonia hydroxide (TEAH).

Figure 7:
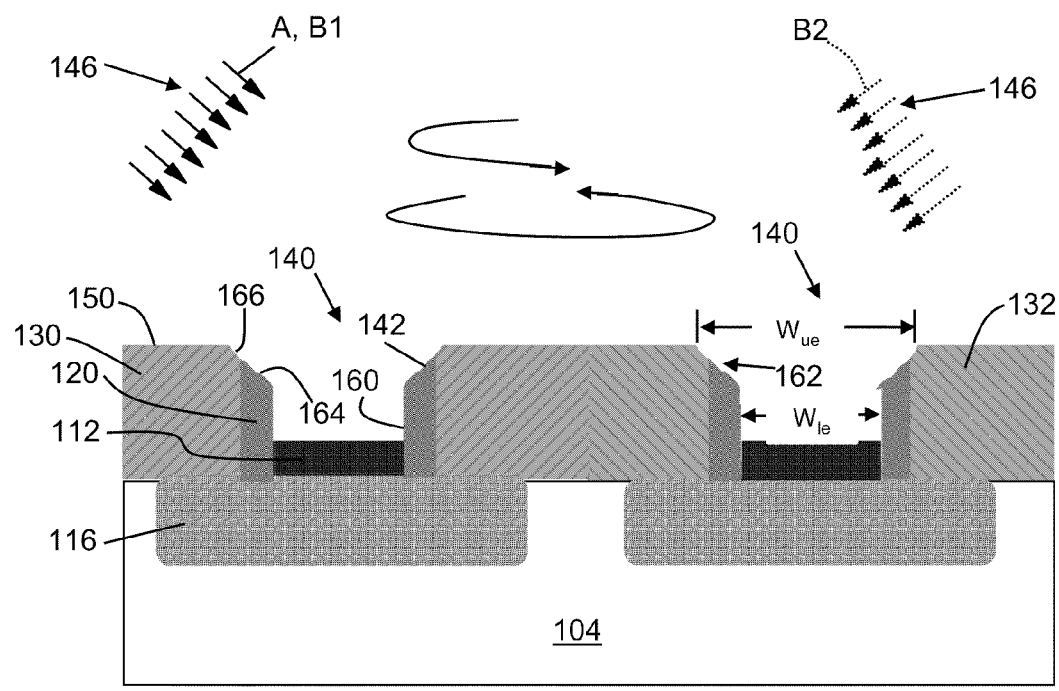

FIG. 7 shows performing an off-axis sputtering 146 to create an angled entrance 142 (shown in left side of FIG. 7 only for clarity) on gate opening 140. Sputtering, as known in the art, may include bombardment of a solid target by high energy chemically inert ions (e.g., $Ar^+$) extracted from a plasma. The sputtering causes ejection of atoms from the solid target. "Off-axis" indicates that, in contrast to conventional techniques, the direction of the sputtering is not perpendicular to a surface 150 of dielectric layer 130, 132. Sacrificial oxide layer 112 protects active region 116 during this process). In one embodiment, off-axis sputtering 146 employs an angle in the range of approximately 70° to 89° relative to surface 150 of dielectric layer 130, 132. (Note, the sputtering directions illustrated in FIG. 7 are exaggerated for clarity). This range of angles ensures the sputtering ion does not shear off the surface and will open up the top of gate opening 140. The angle range also prevents too much chamfering of the top, which may allow creation of electric shorts between neighboring gates. Also, angles outside the stated range may result in some portion of the sputtering ion reaching the bottom of gate opening 140, necessitating a thicker sacrificial oxide layer 112, which makes the removal of layer 122 more difficult.

In one embodiment, off-axis sputtering 146 results in a lower extent 160 (left side) of gate opening 140, i.e., within vertical sidewalls of spacer 120, having a width ($W_{le}$, right side of FIG. 7 only) of, for example, approximately 15 to 40 nanometers. In contrast, an upper extent 162 of gate entrance 142, i.e., at widest portion, has a width ($W_{ue}$, right side of FIG. 7) of approximately 1.05 to 1.25 times the width $W_{le}$ of lower extent 160 of gate opening 140, i.e., approximately 15.75 to 50 nanometers based on the above-stated illustrative range. Off-axis sputtering 146 may result in an angled surface 164 in spacer 120, and perhaps an angled surface 166 in dielectric layer 130, 132 depending on the width of spacer 120.

Off-axis sputtering 146 may be carried out in a number of ways. In one embodiment, indicated with letter A, off-axis sputtering 146 includes continually rotating (circular arrow) substrate 104 relative to a direction of the sputtering to create angled entrance 142 along substantially all of gate opening 140. In an alternative embodiment, indicated with letters B1, B2, off-axis sputtering 146 may include performing a first off-axis sputtering B1 to create angled entrance 142 along a first edge of gate opening 140 (left side of each gate opening). Substrate 102 is then rotated (indicated by semi-circular arrow) relative to a direction of first off-axis sputtering B1 to expose a second edge of gate opening 140 (right side of each gate opening as illustrated). A second off-axis sputtering B2 (shown in phantom as a mirror image of B1) to create angled entrance 142 along the second edge of gate opening 140 is then performed. In either case, the structure is substantially similar to that illustrated in FIG. 7 when viewed in cross-section.

Figure 8:
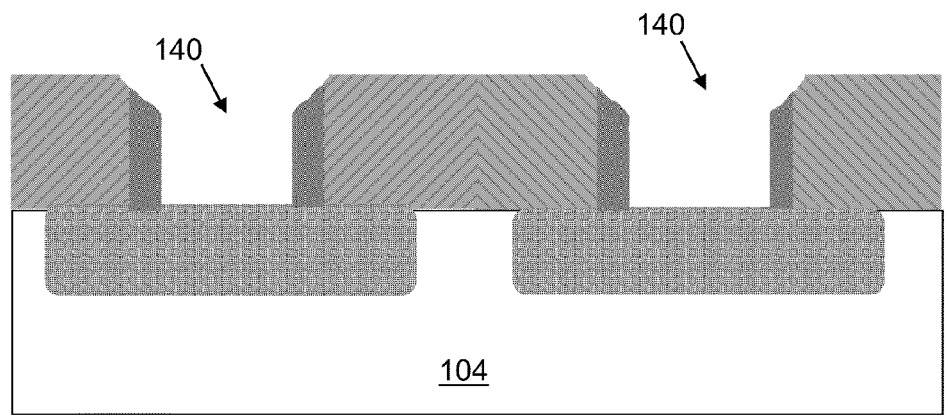

Turning to FIG. 8, sacrificial oxide layer 112 (FIG. 7) is removed, i.e., to expose active region 116. As noted above, in one embodiment, sacrificial oxide layer 112 may include a low density oxide such that it can be readily removed, using, for example, a diluted hydrofluoric acid (DHF) wet etch and/or a buffered hydrofluoric acid wet etch, without harming spacer 120.

Figure 9:
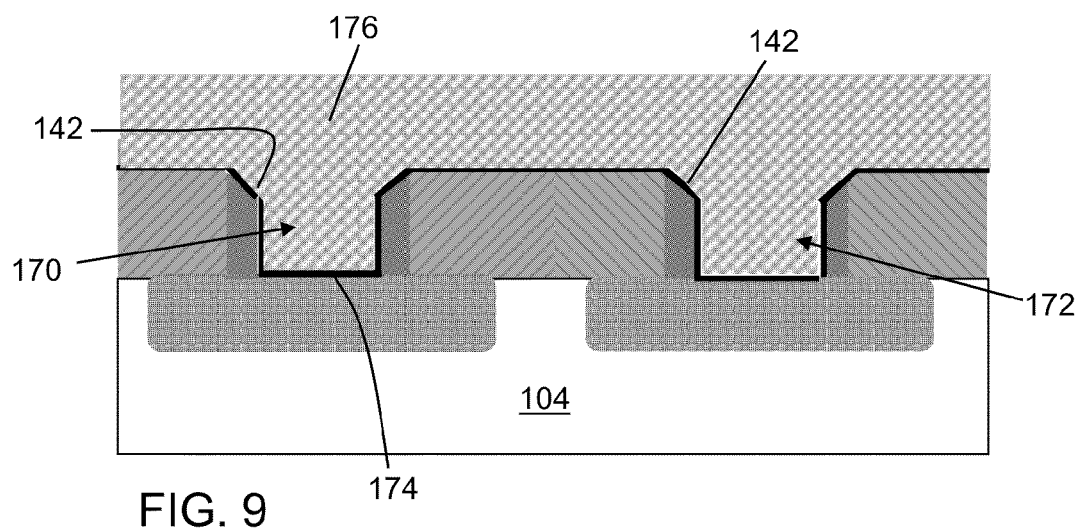

FIG. 9 shows forming a replacement gate 170, 172 in gate opening 140 (FIG. 8). This process may include any now known or later developed replacement gate techniques. For example, in one embodiment, forming of replacement gate 170, 172 may include depositing a high dielectric constant (high-k) layer 174 in gate opening 140 (FIG. 8) to form a gate dielectric layer. High-k layer 174 may include but is not limited to: hafnium silicate (HfSiO), hafnium oxide ($HfO_2$), zirconium silicate ($ZrSiO_x$), zirconium oxide($ZrO_2$), silicon oxide ($SiO_2$), silicon nitride ($Si_3N_4$), silicon oxynitride (SiON), or any other high-k material (>4.0) or any combination of these materials. Next, as also shown in FIG. 9, a metal 176 is deposited in gate opening(s) 140 (FIG. 8). As illustrated, in contrast to conventional gate openings, angled entrance 142 substantially prevents a void from forming in metal 176. Metal 176 may include any work function metal, seal metal, and/or low resistance bulk metal fill appropriate for the FET to be created. For example, aluminum, titanium nitride (TiN) or ruthenium (Ru) for a PFET 172, or titanium aluminum (TiAl), aluminum nitride (AlN) or tantalum carbide (TaC) for an NFET 170. Although shown as a single metal deposition, it is understood that multiple metal depositions using appropriate masking techniques may be employed to provide the appropriate metal over the correct areas. In any event, angled entrance 142 substantially prevents metal 176 from forming voids in gate opening 140, e.g., by enlarging gate opening 140 such that the absolute critical dimension at which the metal will not flow into the gate opening is avoided. Angled entrance 142 also provides this functioning without violating any design ground rules of the gate dimension.

Figure 10:
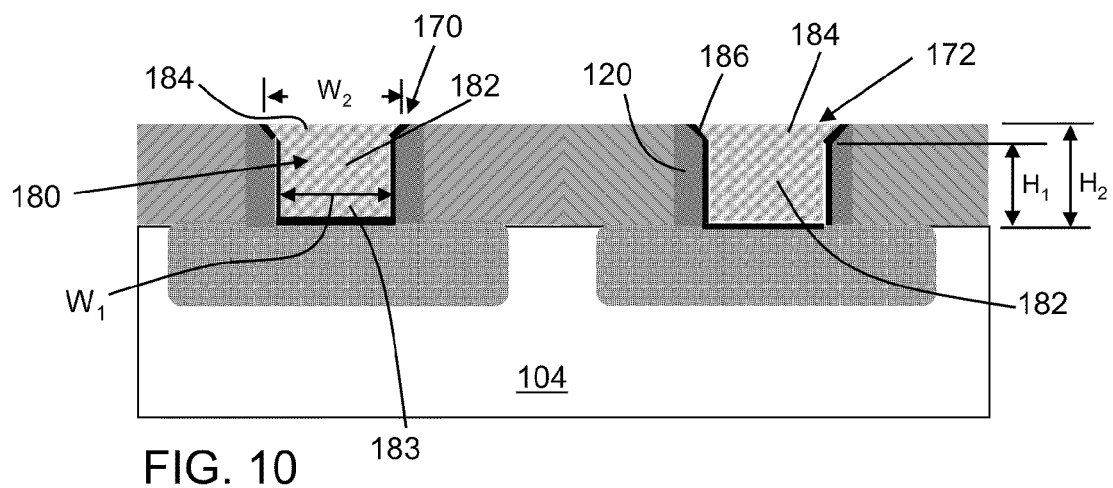
Figure 11:
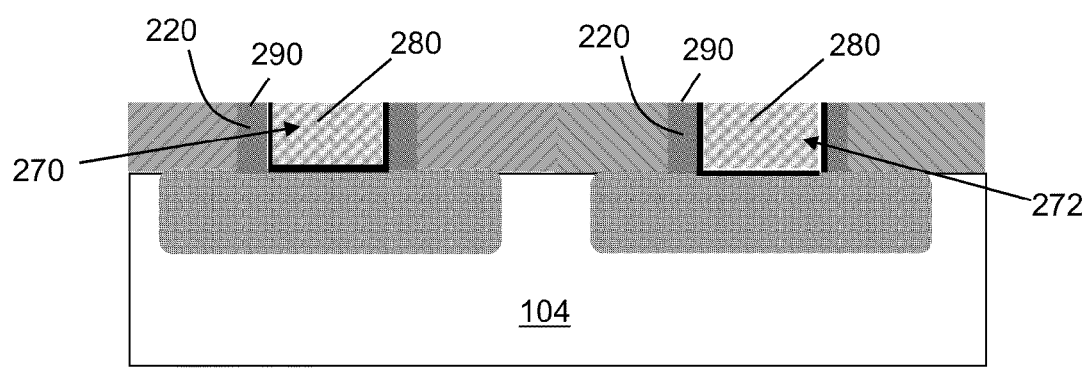

FIGS. 10 and 11 show the structure after subsequent and conventional processing, most notably, planarization, e.g., CMP. In FIG. 10, in one embodiment, the planarization does not entirely remove angled entrance 142 (FIG. 7) to gate opening 140 (FIG. 7). Consequently, a resulting transistor 170, 172 has a different structure compared to conventional transistors. In particular, planarization removes a sufficient amount of metal 176 (FIG. 9) such that a metal gate 180 includes a gate body 182 having a lower extent 183 having a first width $W_1$ and an upper extent 184 having a second width $W_2$ with the second width being greater than the first width. As illustrated, upper extent 184 also has a substantially trapezoid cross-sectional shape. Further, each spacer 120 positioned adjacent to gate body 180 includes an inwardly angled upper end 186 complimentary to upper extent 184 of gate body 182, i.e., so as to form a concave and upwardly facing surface. In other words, each spacer 120 positioned adjacent to gate body 182 has a first height $H_1$ proximate to gate body 180 and a second height $H_2$ laterally distal from gate body 182, where the second height $H_2$ is greater than the first height $H_1$.

In FIG. 11, in an alternative embodiment, the planarization entirely removes angled entrance 142 (FIG. 7) to gate opening 140 (FIG. 7). Nonetheless, a resulting transistor 270, 272 also has a different structure compared to conventional transistors. In particular, a spacer 220 adjacent to a gate body 280 has a substantially horizontally planar upper surface 290. In contrast, conventional spacers have a rounded off edge, substantially similar to that shown in FIG. 2, due to the reactive ion etch used to form them.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from cell phones, toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:
1. A method comprising:
   forming a dummy gate in a dielectric layer on a substrate, the dummy gate including a sacrificial oxide layer and a dummy gate body over the sacrificial oxide layer;

removing the dummy gate body resulting in a gate opening with the sacrificial oxide layer in a bottom of the gate opening;

performing an off-axis sputtering to create an angled entrance in an upper extent of the gate opening, wherein a lower extent of the gate opening remains substantially perpendicular relative to the dielectric layer;

removing the sacrificial oxide layer; and forming a replacement gate in the gate opening.

2. The method of claim 1, wherein the dummy gate forming further includes forming a cap over the dummy gate body.

3. The method of claim 1, wherein the off-axis sputtering performing includes continually rotating the substrate relative to a direction of the sputtering to create the angled entrance along substantially all of the upper extent of the gate opening.

4. The method of claim 1, wherein the off-axis sputtering performing includes:

performing a first off-axis sputtering to create the angled entrance along a first edge of the gate opening, rotating the substrate relative to a direction of the first off-axis sputtering to expose a second edge of the gate opening, and performing a second off-axis sputtering to create the angled entrance along the second edge of the gate opening.

5. The method of claim 1, wherein the off-axis sputtering employs an angle in the range of approximately 70° to 89° relative to a surface of the dielectric layer.

6. The method of claim 1, wherein the dummy gate body removing includes performing a wet etch selective to the sacrificial oxide layer.

7. The method of claim 6, wherein the dummy gate body includes polysilicon and the wet etch uses ammonium hydroxide.

8. The method of claim 1, wherein the sacrificial oxide layer includes at least one of silicon oxide and silicon oxynitride having a low density.

9. The method of claim 1, wherein the replacement gate forming includes:

depositing a high dielectric constant layer in the gate opening, and depositing a metal in the gate opening, whereby the angled entrance substantially prevents a void from forming in the metal.

10. The method of claim 1, wherein the lower extent of the gate opening has a width of approximately 15 to 40 nanometers.

11. The method of claim 1, wherein the upper extent of the gate opening has a width of approximately 1.05 to 1.25 times a width of the lower extent of the gate opening.

12. The method of claim 1, wherein the dielectric layer includes an intrinsic stress.

13. A method comprising:

forming a dummy gate in a dielectric layer on a substrate, the dummy gate including a sacrificial oxide layer, a dummy gate body over the sacrificial oxide layer and a cap over the dummy gate body;

removing the dummy gate body resulting in a gate opening with the sacrificial oxide layer in a bottom of the gate opening;

performing an off-axis sputtering to create an angled entrance in an upper extent of the gate opening, the off-axis sputtering employing an angle in the range of approximately 70° to 89° relative to a surface of the dielectric layer, wherein a lower extent of the gate opening remains substantially perpendicular relative to the dielectric layer;

removing the sacrificial oxide layer by performing a wet etch selective to the sacrificial oxide layer; and forming a replacement gate in the gate opening.

14. The method of claim 13, wherein the off-axis sputtering performing includes continually rotating the substrate relative to a direction of the sputtering to create the angled entrance along substantially all of the upper extent of the gate opening.

15. The method of claim 13, wherein the off-axis sputtering performing includes:

performing a first off-axis sputtering to create the angled entrance along a first edge of the gate opening, rotating the substrate relative to a direction of the first off-axis sputtering to expose a second edge of the gate opening, and performing a second off-axis sputtering to create the angled entrance along the second edge of the gate opening.

16. The method of claim 13, wherein the sacrificial oxide layer includes at least one of silicon oxide and silicon oxynitride having a low density.

17. The method of claim 13, wherein the lower extent of the gate opening has a width of approximately 15 to 40 nanometers.

18. The method of claim 13, wherein an upper extent of the angled entrance has a width of approximately 1.05 to 1.25 times a width of the lower extent of the gate opening.

19. A method comprising:

forming a dummy gate in a dielectric layer on a substrate, the dummy gate including a sacrificial oxide layer, a dummy gate body over the sacrificial oxide layer and a cap over the dummy gate body, wherein the sacrificial oxide layer includes at least one of silicon oxide and silicon oxynitride having a low density;

removing the dummy gate body resulting in a gate opening with the sacrificial oxide layer in a bottom of the gate opening;

performing an off-axis sputtering to create an angled entrance in an upper extent of the gate opening, the off-axis sputtering employing an angle in the range of approximately 70° to 89° relative to a surface of the dielectric layer and including continually rotating the substrate relative to a direction of the sputtering to create the angled entrance along substantially all of the gate opening, wherein a lower extent of the gate opening remains substantially perpendicular relative to the dielectric layer;

removing the sacrificial oxide layer by performing a wet etch selective to the sacrificial oxide layer; and forming a replacement gate in the gate opening.

20. The method of claim 19, wherein an upper extent of the angled entrance has a width of approximately 1.05 to 1.25 times a width of the lower extent of the gate opening.

* * * * *